(12) United States Patent
Shim

(10) Patent No.: US 7,884,401 B2
(45) Date of Patent: Feb. 8, 2011

(54) CMOS IMAGE SENSOR AND MANUFACTURING METHOD THEREOF

(75) Inventor: Hee Sung Shim, Gangneung-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 440 days.

(21) Appl. No.: 12/004,533

(22) Filed: Dec. 21, 2007

(65) Prior Publication Data
US 2008/0157152 A1 Jul. 3, 2008

(30) Foreign Application Priority Data
Dec. 27, 2006 (KR) ...................... 10-2006-0135636

(51) Int. Cl.
*H01L 31/00* (2006.01)
(52) U.S. Cl. ...................... 257/292; 257/233; 257/239; 257/291; 257/E27.132; 257/E27.133
(58) Field of Classification Search ........................ None
See application file for complete search history.

(56) References Cited

U.S. PATENT DOCUMENTS

| | | | |
|---|---|---|---|
| 6,903,394 B2 | 6/2005 | Agarwal | |
| 6,960,796 B2 | 11/2005 | Rhodes et al. | |
| 6,974,718 B2 | 12/2005 | Agarwal | |
| 7,078,746 B2 | 7/2006 | Hong | |
| 7,498,623 B2 | 3/2009 | Hong | |
| 2004/0099892 A1 | 5/2004 | Agarwal | |

(Continued)

FOREIGN PATENT DOCUMENTS

CN 1849816 A 10/2006

(Continued)

OTHER PUBLICATIONS

Bishnu Kei Agarwal; CMOS Imager with Improved Color Reponse; Publication Patent Gazette; Publication No. 10-2005-0086854; Publication Date: Aug. 30, 2005; Korean Intellectual Property Office, Republic of Korea.

(Continued)

*Primary Examiner*—Sue Purvis
*Assistant Examiner*—Fei Fei Yeung Lopez
(74) *Attorney, Agent, or Firm*—The Law Offices of Andrew D. Fortney; Andrew D. Fortney

(57) ABSTRACT

The embodiment relates to a complementary metal oxide semiconductor (CMOS) image sensor and more particularly, to a CMOS image sensor and a manufacturing method thereof capable of improving electron storing capacity in a floating diffusion area. The CMOS image sensor includes a first gate electrode on a semiconductor substrate; a photodiode in the semiconductor substrate on one side of the first gate electrode; a floating diffusion area in the semiconductor substrate on an opposite side of the first gate electrode; a capacitor including a lower capacitor electrode connected to the floating diffusion area, a dielectric layer on the lower capacitor electrode, and an upper capacitor electrode; a drive capacitor coupled to the lower capacitor electrode and having a second gate electrode connected to the floating diffusion area. The electron storing capacity of the floating diffusion node is increased, making it possible to improve the dynamic range of the image sensor.

20 Claims, 3 Drawing Sheets

U.S. PATENT DOCUMENTS

2004/0149887 A1     8/2004     Agarwal
2005/0012168 A1     1/2005     Hong
2006/0256221 A1*   11/2006   Mckee et al. ................ 348/308

FOREIGN PATENT DOCUMENTS

KR     10-2004-0093940     11/2004
KR     10-2005-0086854      8/2005

OTHER PUBLICATIONS

Won Ho Lee; Unit Pixel of CMOS Image Sensor Reducing Capacitance of Floating Diffusion Region; Korean Patent Abstracts; Publication No. 1020040093940 A; Publication Date: Nov. 9, 2004; Korean Intellectual Property Office, Republic of Korea.

Chris Hong Sungkwon; "4T CMOS Image Sensor with Floating Diffusion Gate Capacitor"; esp@cenet; Abstract of US20050012168 (A1) corresponding to Chinese Publication No. CN1849816; Publication Date Oct. 18, 2006; esp@cenet Database—Worldwide.

English Translation of Partial Chinese Office Action dated May 8, 2009; Chinese Patent Application No. 2007103081072; The State Intellectual Property Office of P.R.C., People's Republic of China.

* cited by examiner

CMOS IMAGE SENSOR AND MANUFACTURING METHOD THEREOF

PRIORITY CLAIM

This non-provisional application claims priority under 35 U.S.C. §119(a) to Korean Patent Application No. 10-2006-0135636 (filed on Dec. 27, 2006), the subject matter of which is hereby incorporated by reference.

BACKGROUND

Embodiments of the invention relate to a complementary metal oxide semiconductor (CMOS) image sensor.

Generally, the image sensor is a semiconductor device converting an optical image into an electrical signal. Such image sensors include charge coupled devices (CCD) where individual metal-oxide-silicon (MOS) capacitors are adjacent to each other and store charge carriers and transfer them, and CMOS (complementary MOS) image sensors adopting a switching manner that includes a number of MOS transistors somewhat dependent on the number of pixels and that uses a CMOS technology for making peripheral circuits, a control circuit, and a signal processing circuit that sequentially detect and output image data. The CMOS image sensor converts the optical information of a subject into electrical signals by signal processing devices including photodiodes, an amplifier, an A/D converter, an internal voltage generator, a timing generator, digital logic, etc., included in one chip, having great advantages of reduction of space, power, and costs.

Meanwhile, CMOS image sensors include a 3T type, a 4T type, a 5T type, etc., according to the number of transistors per unit pixel. The 3T type is constituted by one photodiode and three transistors per unit pixel, and the 4T type is constituted by one photodiode and four transistors per unit pixel.

Herein, the layout for the unit pixel of the 4T type CMOS image sensor will be described. FIG. 1 is an equivalent circuit view of a 4T type CMOS image sensor of the related art, and FIG. 2 is a layout showing a unit pixel of a 4T type CMOS image sensor of the related art.

As shown in FIGS. 1 and 2, a unit pixel 100 of a CMOS image sensor comprises a photodiode 10 as a photoelectric converter and four transistors. The four transistors are a transfer transistor 20, a reset transistor 30, a drive transistor 40, and a select transistor 50, respectively. And, a load transistor 60 is electrically connected to the output terminals OUT of the respective unit pixels 100.

Herein, FD represents a floating diffusion region, Tx represents the gate voltage of the select transistor 20, Rx represents the gate voltage of the reset transistor 30, Dx represents the gate voltage of the drive transistor 40 (and which is also the voltage on the floating diffusion region FD), and Sx represents the gate voltage of the select transistor 50.

In the unit pixel of the 4T type CMOS image sensor in the related art, an active region is defined so that a device isolating layer is formed in a portion of the substrate other than the active region, as shown in FIG. 2. One photodiode PD is formed in the portion of the active region having a wide width, and the gate electrodes 23, 33, 43, and 53 of the four transistors are formed in another portion of the active region. In other words, a transfer transistor 20 includes the gate electrode 23, a reset transistor 30 includes the gate electrode 33, a drive transistor 40 includes the gate electrode 43, and a select transistor 50 includes the gate electrode 53.

Herein, the active regions of the respective transistors (excluding the channel under the respective gate electrodes 23, 33, 43, and 53) are implanted with impurity ions so that source/drain (S/D) regions of the respective transistors are formed.

When the entire well-capacity of the photodiode PD is larger than the charge holding capacity of the floating diffusion area FD, the charge between the photodiode and the floating diffusion area is shared. In this case, if the gate electrode 23 of the transfer transistor returns to an off state, the photodiode still has a signal or charge, which will be mixed with the signal or charge generated in the next frame, thereby leading to image lag. This saturation of the floating diffusion node 25 usually limits the dynamic range of a 4T pixel.

Further, as the pixel becomes smaller, the capacity of the floating diffusion area becomes smaller. This makes the dynamic range of the pixel much smaller. Accordingly, even when the pixel is small, a need exists for an improvement of the dynamic range to provide a good output response for both low light and high light conditions.

BRIEF SUMMARY

It is an object of the embodiment to provide a CMOS image sensor and manufacturing method thereof capable of improving a CMOS image sensor dynamic range by increasing an electron storing capacity of a floating diffusion node.

In order to accomplish the objects, there is provided a CMOS image sensor comprising a first gate electrode on a semiconductor substrate; a photodiode in the semiconductor substrate on one side of the first gate electrode; a floating diffusion area in the semiconductor substrate on an opposite side of the first gate electrode; a capacitor comprising a lower capacitor electrode connected to the floating diffusion area, a dielectric layer on the lower capacitor electrode, and an upper capacitor electrode; a drive transistor having a second gate electrode connected to the floating diffusion area and the lower capacitor electrode.

In order to accomplish the objects, there is also provided a method of manufacturing a CMOS image sensor comprising the steps of forming a first gate electrode, a second gate electrode and a lower capacitor on a semiconductor substrate, the lower capacitor electrode extending from the second electrode; forming a photodiode area by implanting impurity ions in the semiconductor substrate on one side of the first gate electrode; forming a floating diffusion area by implanting impurity ions in the semiconductor substrate on an opposite side of the first gate electrode; forming a dielectric layer on at least a part of the lower capacitor electrode; forming an upper capacitor electrode on the dielectric layer; forming an insulating film on the semiconductor substrate; forming a first and second contact holes in the insulating film, the first contact hole exposing a part of the lower capacitor electrode and a part of the floating diffusion area and the second contact hole exposing a part of the upper capacitor electrode; and forming first and second contact electrodes, the first contact electrode connecting the floating diffusion area to the lower capacitor electrode (in the first contact hole) and the second contact electrode being connected to the upper capacitor electrode (in the second contact hole).

Other systems, methods, features and advantages will be, or will become, apparent to one with skill in the art upon examination of the following figures and detailed description. Nothing in this section should be taken as a limitation on those claims. Further aspects and advantages are discussed below in conjunction with various embodiments of the invention.

DETAILED DESCRIPTION

Hereinafter, a CMOS image sensor will be described with reference to the accompanying drawings.

Figure 1:
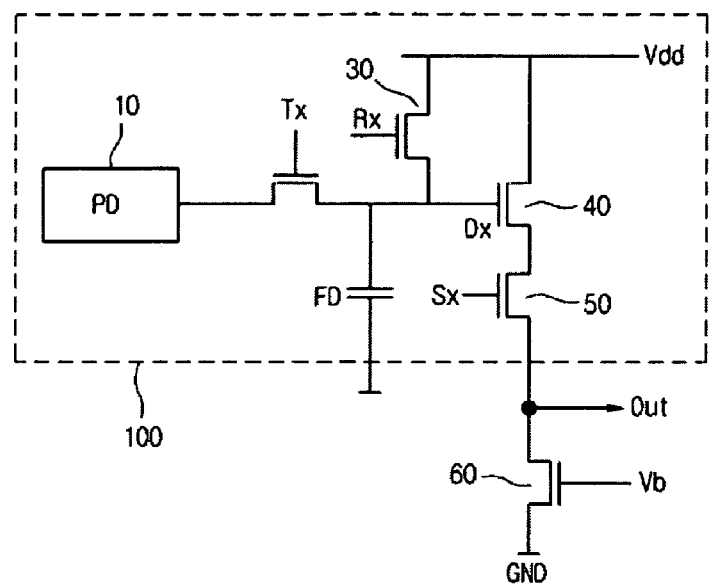
FIG. 1 is an equivalent circuit diagram of a 4T type CMOS image sensor of the related art.
Figure 2:
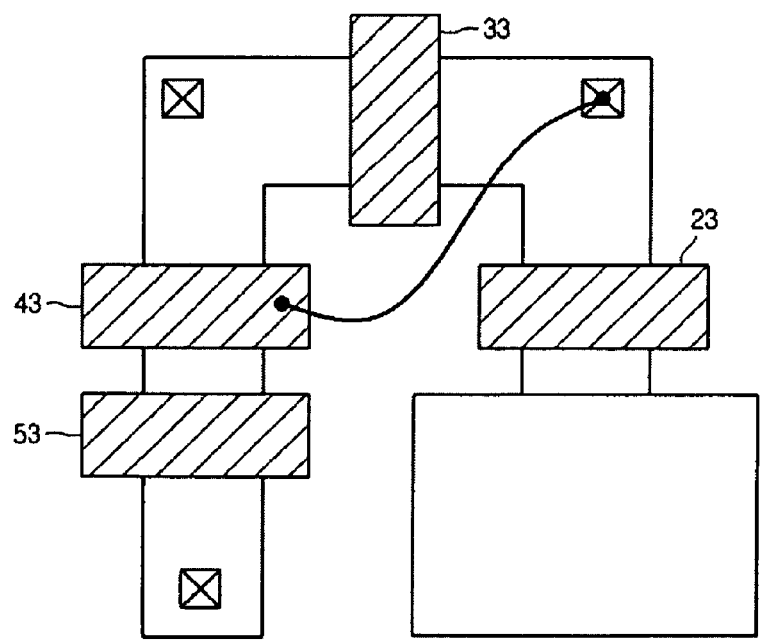
FIG. 2 is a layout of the unit pixel of a 4T type CMOS image sensor of the related art.
Figure 3:
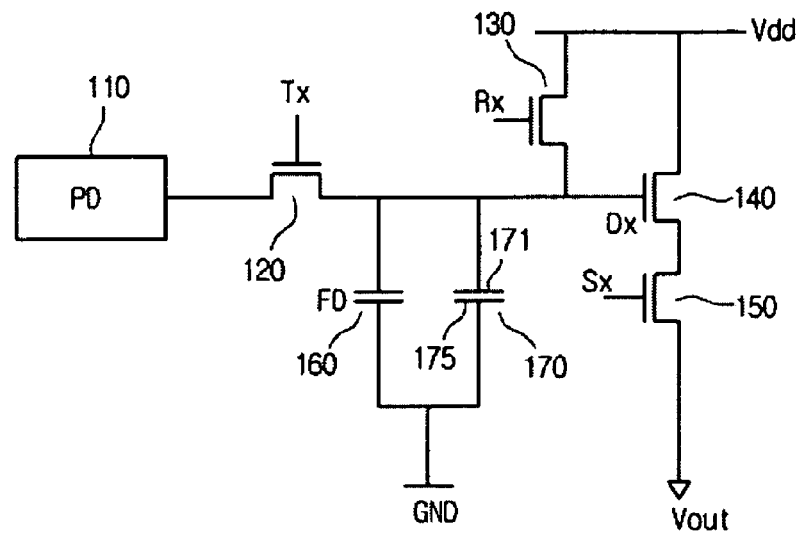
FIG. 3 is an equivalent circuit diagram of 4T type CMOS image sensor according to an embodiment.
Figure 4:
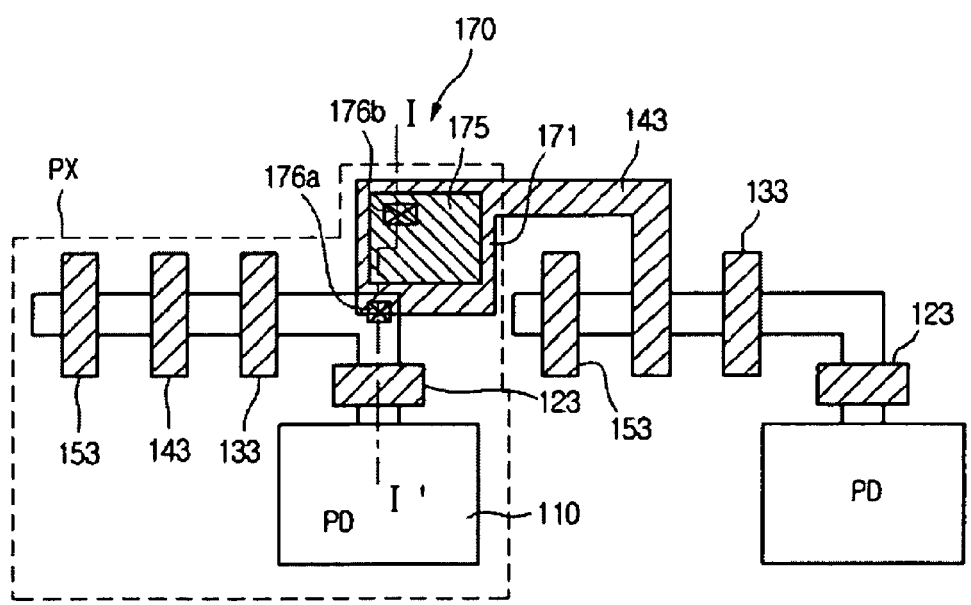
FIG. 4 is a layout of an exemplary unit pixel of a CMOS image sensor according to embodiments of the invention.

FIG. 3 is an equivalent circuit diagram of 4T type CMOS image sensor according to one embodiment, and FIG. 4 is an exemplary layout of a CMOS image sensor according to other embodiments.

As shown in FIGS. 3 and 4, the unit pixel of the CMOS image sensor includes a photodiode 110 as a photoelectric converter, and four transistors. The respective four transistors are a transfer transistor 120, a reset transistor 130, a drive transistor 140, and a select transistor.

Herein, FD represents a floating diffusion area, Tx represents the gate voltage of the select transistor 120, Rx represents the gate voltage of the reset transistor 130, Dx represents the gate voltage of the drive transistor 140, and Sx represents the gate voltage of the select transistor 150. In addition to the native junction capacitor 160 present in all diffusion regions, the floating diffusion area FD is provided with a physical capacitor 170.

The capacitor 170 comprises a lower capacitor electrode 171 and an upper capacitor electrode 175. Between the lower capacitor electrode 171 and the upper capacitor electrode 175 is a dielectric layer 173.

The gate electrode 143 of the drive transistor 140 is coupled to the floating diffusion area FD by contact 176a, and the polysilicon pattern that forms the gates of all of the transistors is designed to form the lower capacitor electrode 171 connected to the gate electrode 143 of the drive transistor 140. Accordingly, the drive transistor 140 and the floating diffusion area FD are connected, avoiding a need for a metal wiring to do so, as well as forming the lower capacitor electrode 171 of the capacitor 170. As a result, the present invention may reduce the size of the unit pixel as well as increase the electron storing capacity of the floating diffusion node by minimizing the area for forming the capacitor 170.

In FIG. 4, the gate electrode 143 of the drive transistor 140 extends to the lower capacitor plate 171, and is connected to the floating diffusion area FD via contact 176B, for convenience of layout. Although not shown, an active area is defined in the unit pixel PX of the 4T type CMOS image sensor so that a device isolating layer is formed in a portion other than the active area.

One photodiode PD 100 is formed in a portion of the active area having a relatively wide width, and the gate electrodes 123, 133, 143, and 153 of the four transistors are formed in the remaining portion of the active area. Referring back to FIG. 3, the transfer transistor 120 is formed using the gate electrode 123 (see FIG. 4), the reset transistor 130 is formed using the gate electrode 133, the drive transistor 140 is formed using the gate electrode 143, and the select transistor 150 is formed using the gate electrode 153.

The gate electrode 143 of the drive transistor 140 extends to the floating diffusion area FD so that it is electrically connected to the floating diffusion area FD and at the same time, serves as the lower capacitor electrode 171 of the capacitor 170. The dielectric layer 173 and the upper capacitor electrode 175 are sequentially deposited on the upper surface of the lower capacitor electrode 171 of the capacitor 170. The upper capacitor electrode 175 may comprise a polysilicon layer so that the capacitor 170 can be a poly insulator poly (PIP) capacitor. Alternatively, the capacitor can comprise a Metal Insulator Metal (MIM) structure.

The upper capacitor electrode 175 may be connected to a contact electrode in a second contact hole 176b to receive a ground signal GND. Thereby, the junction capacitor 160 and the additional capacitor 170 overlapping the floating diffusion area FD can be connected in parallel.

Herein, the active area of the respective transistors are implanted with impurity ions in areas other than below the gate electrodes 123, 133, 143, and 153 to form the source/drain (S/D) areas of the respective transistors.

Figure 5:
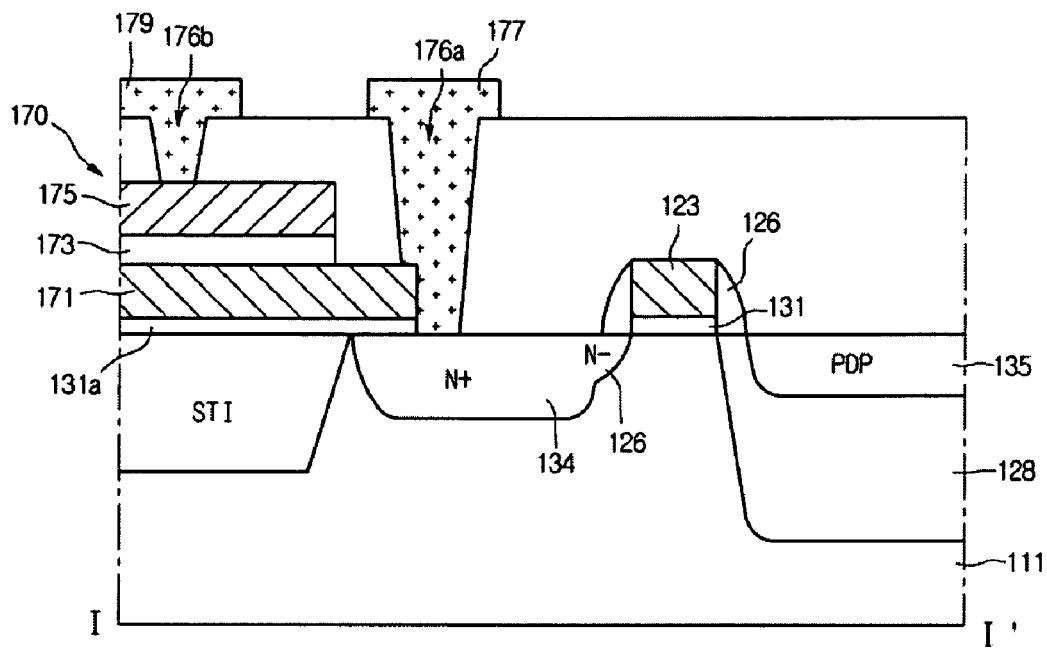
FIG. 5 is a cross-sectional view taken along line I-I, of FIG. 4 and shows a capacitor, a transfer transistor, and a photodiode area.

FIG. 5 is a cross-sectional view taken along I-I' line of FIG. 4 and shows the capacitor, transfer transistor, and a part of the photodiode area.

As shown in FIGS. 4 and 5, a low-concentration P-type epitaxial silicon layer 111 is grown on a high-concentration P-type substrate, and a trench is formed in the epi-layer 111 and filled with an insulator (e.g., silicon dioxide) to form a shallow trench isolation (STI) structure. Then, a gate insulating film 131 is formed on the epi-layer (typically by wet or dry thermal oxidation of silicon), and the gate electrode 123 of the transfer transistor 120 is formed on the gate insulating film 131 (generally by photolithographic patterning and etching of a polysilicon layer formed on the gate insulating film). The other gates 133, 143 and 153 (along with the lower capacitor electrode 171) are formed at the same time as gate electrode 123.

Then, the photodiode area PD is formed in the epi-layer 111 by implantation of n-type impurity ions at a low concentration to form N-diffusion area 128, and separately, N-lightly doped extensions 126 are formed in the active area adjacent to gate 123 as well as the other gates 133, 143 and 153. A spacer 126 is then formed on sides of the gate electrode 123 (and generally on sides of the other gates 133, 143 and 153, as well as the lower capacitor electrode 171). The epi-layer 111 of the low-concentration n-type diffusion area 128 is implanted with a p-type diffusion area 135 (PDP) with higher concentration than that of the epi-layer 111. Then, in the floating diffusion area FD and the S/D areas in the active area. high-concentration n-type diffusion areas 134 are formed by ion implantation.

The capacitor 170 is formed on or adjacent to the floating diffusion area FD. On the floating diffusion area FD is formed the gate insulating film pattern 131a (but not necessarily over the STI region), and the lower capacitor electrode of the subsidiary capacitor 170 formed simultaneously with the gate electrode 123 of the transfer transistor. The subsidiary capacitor 170 overlaps a predetermined portion of the floating diffusion area FD and can be formed on the upper surface of the device isolating layer (STI) near the floating diffusion area FD.

The lower capacitor electrode 171 of the subsidiary capacitor 170 is associated with a routing process in forming or designing the gate electrode 143 of the drive capacitor 140, without using a separate process so that the gate electrode 143 extends to the floating diffusion area FD. The floating diffusion area FD is connected to the lower capacitor electrode 171. The capacitor 170 comprises the lower capacitor electrode 171, the upper capacitor electrode 175, and the dielectric layer 173 between the lower capacitor electrode 171 and the upper capacitor electrode 175.

The gate electrode 123 of the drive transistor 120 extends to the floating diffusion area FD to form the lower capacitor electrode 171. Accordingly, this connects the drive transistor 140 and the floating diffusion area FD, substituting a polysilicon line for metal wiring, as well forming the lower capacitor electrode 171 of the capacitor 170. Accordingly, it may reduce the size of the unit pixel as well as increase the electron storing capacity of the floating diffusion node by minimizing the area for the capacitor 170.

The dielectric layer 173 is formed on the lower capacitor electrode 171 to store electrons, and the upper capacitor electrode 175 is formed on the dielectric layer 174 to face the lower capacitor electrode 171. The upper capacitor electrode 175 preferably comprises a polysilicon pattern, but the lower capacitor electrode 171 and the upper capacitor electrode 175 can be formed in a metal pattern. Alternatively, the upper capacitor electrode 175 can comprise a metal (e.g., in the first layer of metallization) or a local interconnect material (e.g., Ti, TiN, W, combinations thereof, etc.), as the term "local interconnect" is known in the art.

An insulating film 180 is formed on the epi-layer 111, including the gate electrode 123 of the transfer transistor 120, the capacitor 170, and the other gates 133, 143 and 153. A first contact hole 176a and a second contact hole 176b are formed in the insulating film 180 that exposes (predetermined) portions of the floating diffusion area FD and the lower capacitor electrode 171 and the upper capacitor electrode 175, respectively. First and second contact electrodes 177 and 179 are formed in the first contact hole 176a and the second contact hole 176b, respectively. The first contact electrode 177 is connected to the lower capacitor electrode 171 and the floating diffusion area FD so that the lower capacitor electrode 171 and the floating diffusion area FD are electrically connected. The second contact electrode 179 is connected to the upper capacitor electrode 175 and can apply a predetermined voltage (e.g., a ground potential) to the upper capacitor electrode 175 through the second contact electrode 179.

The junction capacitor 160 of the floating diffusion area FD may be formed in a depletion layer between the high-concentration n-type diffusion area and the p-type epi-layer, and the p-type epi-layer may have a ground potential so that the junction capacitor 160 of the floating diffusion area and the additional capacitor 170 are connected to each other in parallel.

Accordingly, the electron storing capacity is increased to improve the dynamic range of the 4T pixel.

Also, even when the size of the pixel is small, the capacity of the floating diffusion area is enough so that the dynamic range can be ensured. Accordingly, even when the pixel is small, a good output response is provided for low light and high light conditions.

Figure 6:
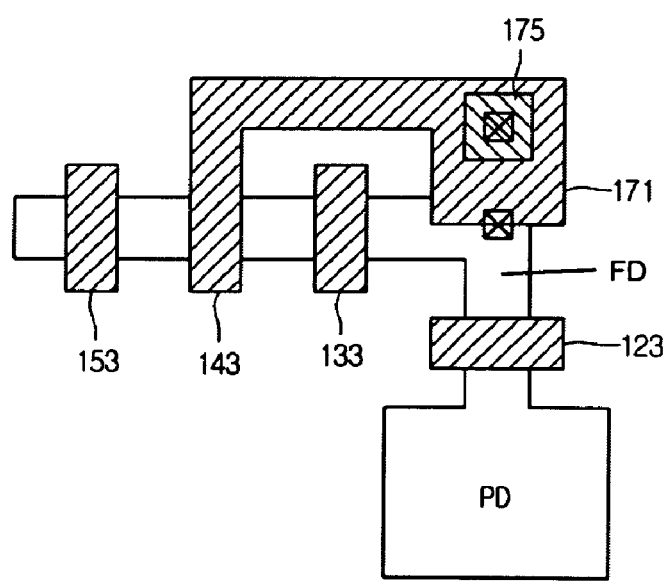
FIG. 6 is a layout of another exemplary unit pixel of a CMOS image sensor according to embodiments of the invention.

FIG. 6 shows an alternative layout in which the lower electrode 171 overlaps the floating diffusion region adjacent to the gate 133 of the reset transistor closest to the gate 143 of the drive transistor to which the lower electrode 171 is connected. Such an embodiment may offer greater capacitive coupling between the capacitor 170 and the floating diffusion region. Also, the upper capacitor electrode 175 may cover the lower capacitor electrode 171 everywhere except in the region around the contact to the floating diffusion region FD.

A first effect of the present CMOS image sensor is that it increases the electron storing capacity of the floating diffusion node to improve the dynamic range by further forming a capacitor in the unit pixel.

Also, a second effect of the invention is that it forms a capacitor electrode by extending the gate electrode of the drive transistor to a floating diffusion area to minimize the area for forming the capacitor, so that the size of the unit pixel can be reduced as well as the electron storing capacity of the floating diffusion node can be increased.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. A CMOS image sensor comprising:
a first gate electrode on a semiconductor substrate;
a photodiode in the semiconductor substrate on one side of the first gate electrode;
a floating diffusion area in the semiconductor substrate on an opposite side of the first gate electrode;
a capacitor comprising a lower capacitor electrode connected to the floating diffusion area, a dielectric layer on the lower capacitor electrode, and an upper capacitor electrode; and
a drive transistor having a second gate electrode connected to the floating diffusion area and the lower capacitor electrode, wherein the second gate electrode and the lower capacitor electrode are formed from a single continuous layer of polysilicon.

2. A CMOS image sensor comprising:
a first gate electrode on a semiconductor substrate;
a photodiode in the semiconductor substrate on one side of the first gate electrode;
a floating diffusion area in the semiconductor substrate on an opposite side of the first gate electrode;
a capacitor comprising a lower capacitor electrode connected to the floating diffusion area, a dielectric layer on the lower capacitor electrode, and an upper capacitor electrode;
an insulating film covering the capacitor, the insulating film comprising a first contact hole exposing a part of the lower capacitor electrode and a part of the floating diffusion area and a second contact hole exposing a part of the upper capacitor electrode; and
a drive transistor having a second gate electrode connected to the floating diffusion area and the lower capacitor electrode.

3. A CMOS image sensor comprising:
a first gate electrode on a semiconductor substrate;

a photodiode in the semiconductor substrate on one side of the first gate electrode;

a floating diffusion area in the semiconductor substrate on an opposite side of the first gate electrode;

a capacitor comprising a lower capacitor electrode connected to the floating diffusion area, a dielectric layer on the lower capacitor electrode, and an upper capacitor electrode;

a drive transistor having a second gate electrode connected to the floating diffusion area and the lower capacitor electrode; and a transfer transistor, a reset transistor, and a select transistor on the semiconductor substrate, each of which is connected to the drive transistor, wherein the lower capacitor electrode is formed from a common material and has a common thickness with a gate electrode of the transfer transistor.

4. The CMOS image sensor according to claim 3, wherein the second gate electrode and the lower capacitor electrode are formed from a single continuous layer of polysilicon.

5. The CMOS image sensor according to claim 1, further comprising an insulating film covering the capacitor, the insulating film comprising a first contact hole exposing a part of the lower capacitor electrode and a part of the floating diffusion area and a second contact hole exposing a part of the upper capacitor electrode.

6. The CMOS image sensor according to claim 5, further comprising a first contact electrode in the first contact hole, connecting the floating diffusion area to the lower capacitor electrode.

7. The CMOS image sensor according to claim 5, further comprising a second contact electrode in the second contact hole, connecting a ground potential to the upper capacitor electrode.

8. The CMOS image sensor according to claim 1, wherein the capacitor comprises a poly-insulator-poly (PIP) capacitor.

9. The CMOS image sensor according to claim 3, wherein the capacitor comprises a metal-insulator-metal (MIM) capacitor.

10. The CMOS image sensor according to claim 1, wherein the drive transistor has a drain connected to a power supply.

11. The CMOS image sensor according to claim 1, wherein the capacitor overlaps the floating diffusion area.

12. The CMOS image sensor according to claim 1, further comprising a transfer transistor, a reset transistor, and a select transistor on the semiconductor substrate, each of which is connected to the drive transistor.

13. The CMOS image sensor according to claim 12, wherein the lower capacitor electrode is formed from a common material and has a common thickness with a gate electrode of the transfer transistor.

14. The CMOS image sensor according to claim 5, wherein the exposed part of the lower capacitor electrode includes a part of a top surface and a side surface of the lower capacitor electrode.

15. The CMOS image sensor according to claim 2, further comprising a first contact electrode in the first contact hole, connecting the floating diffusion area to the lower capacitor electrode, and a second contact electrode in the second contact hole, connecting a ground potential to the upper capacitor electrode.

16. The CMOS image sensor according to claim 2, wherein the exposed part of the lower capacitor electrode includes a part of a top surface and a side surface of the lower capacitor electrode.

17. The CMOS image sensor according to claim 3, further comprising an insulating film covering the capacitor, the insulating film comprising a first contact hole exposing a part of the lower capacitor electrode and a part of the floating diffusion area and a second contact hole exposing a part of the upper capacitor electrode.

18. The CMOS image sensor according to claim 17, further comprising a first contact electrode in the first contact hole, connecting the floating diffusion area to the lower capacitor electrode, and a second contact electrode in the second contact hole, connecting a ground potential to the upper capacitor electrode.

19. The CMOS image sensor according to claim 3, wherein the capacitor comprises a poly-insulator-poly (PIP) capacitor.

20. The CMOS image sensor according to claim 3, wherein the capacitor overlaps the floating diffusion area.

* * * * *